United States Patent [19]

Capasso et al.

[11] Patent Number: 4,704,622
[45] Date of Patent: Nov. 3, 1987

[54] NEGATIVE TRANSCONDUCTANCE DEVICE

[75] Inventors: Federico Capasso, Westfield; Sergey Luryi, Millington, both of N.J.

[73] Assignee: American Telephone and Telegraph Company, AT&T Bell Laboratories, Murray Hill, N.J.

[21] Appl. No.: 803,108

[22] Filed: Nov. 27, 1985

[51] Int. Cl.$^4$ .................... H01L 27/12; H01L 29/161
[52] U.S. Cl. ............................................ 357/4; 357/16
[58] Field of Search .......................... 357/4 S, 4 L, 16

[56] References Cited

U.S. PATENT DOCUMENTS 4,194,935  3/1980  Dingle ........................... 357/4 S L

OTHER PUBLICATIONS

Applied Physics Letters, 24, Jun. 15, 1974, pp. 593–595.
Journal of Applied Physics, 58, Aug. 1, 1985, pp. 1366–1368.

Primary Examiner—Martin H. Edlow
Attorney, Agent, or Firm—Richard D. Laumann

[57] ABSTRACT

A resonant tunneling device having a one-dimensional quantum well comprises a semiconductor region capable of exhibiting one-dimensional quantization. The device comprises source and drain contact regions adjoining such semiconductor region as well as a gate contact for applying a field to such region; the device can be implemented, e.g., by methods of III-V deposition and etching technology. Under suitable source-drain bias conditions the device can function as a transistor having negative transconductance.

5 Claims, 5 Drawing Figures $V_S = V_D$
$V_G > 0$ $V_S = V_G$
$V_D > 0$

NEGATIVE TRANSCONDUCTANCE DEVICE

TECHNICAL FIELD

This invention relates generally to the field of devices exhibiting negative differential resistance and particularly to such devices based on resonant tunneling.

BACKGROUND OF THE INVENTION

For a long period of time, there has been interest in fabricating devices exhibiting negative differential resistance. In such devices, the current initially increases with increasing voltage but a point is reached after which the current decreases as the voltage increases.

Several physical mechanisms, including resonant tunneling, can be exploited in fabricating devices exhibiting such a characteristic. Perhaps the first device based on resonant tunneling was the double-barrier heterostructure proposed by Chang, Esaki and Tsu; see, for example, *Applied Physics Letters*, 24, pp. 593-595, June 15, 1974. The original Tsu device was a two-terminal device as were most of the other early negative differential resistance devices. More recently, a three-terminal bipolar device has been described which also exhibits negative differential resistance; see, for example, *Journal of Applied Physics*, 58, pp. 1366-1368, Aug. 1, 1985. This device utilizes resonant tunneling of minority carriers through a quantum well in the base region.

Though obviously the details of all these devices differ, they do have one element in common: they all utilize bulk carrier tunneling into a two-dimensional density of states, typically of electrons, in a quantum well.

SUMMARY OF THE INVENTION

We have found that a resonant tunneling device in which the quantum well is a linear, that is, a one-dimensional quantum well rather than two-dimensional, has useful device properties. The tunneling in our structure is of, for example, two-dimensional carriers into a one-dimensional density of states. The latter will, for reasons of convenience, be referred to as a quantum well wire.

The device comprises first and second semiconductor regions and a third semiconductor region between said first and second regions which is capable of exhibiting two-dimensional quantization. There are also first and second electrical contacts to said first and second regions, respectively; such contacts may be to highly doped semiconductor regions having the same conductivity type. In a preferred embodiment, the first and second regions are capable of exhibiting one-dimensional quantization.

The device further comprises means for applying an electric field such as, e.g., a gate electrode for controlling a resonant tunneling current through the quantum well wire.

For reasons of clarity, the elements of the devices depicted are not drawn to scale.

DETAILED DESCRIPTION

Figure 1:
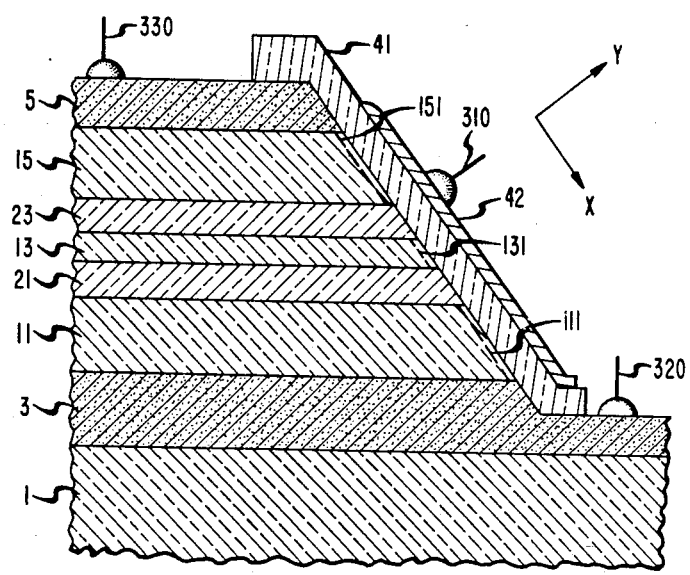
FIG. 1 is a cross section of an exemplary embodiment of a device according to our invention.

An exemplary embodiment of a resonant tunneling device according to our invention is depicted in FIG. 1. The device comprises substrate 1 and disposed thereon: first and second highly doped n-type GaAs layers 3 and 5. Interleaved between said n-type layers 3 and 5 is an undoped region which comprises third, fourth and fifth GaAs layers 11, 13 and 15 and, between these GaAs layers, first and second AlGaAs layers 21 and 23 which are between the third and fourth, and fourth and fifth GaAs layers, respectively. The structure depicted is a mesa structure, and commonly contacting the layers 11, 21, 13, 23, and 15 is an undoped AlGaAs layer 41 on a side of the mesa.

More specifically, the AlGaAs layers may be represented as $Al_xGa_{1-x}As$. Layer 41 has an aluminum content which preferably corresponds to values of x in a range of from 0.3 to 1.0 (and typically near 0.75); the AlGaAs layers 21 and 23 have an aluminum content corresponding to preferred values of x in a range of from 0.2 to 1.0 (and typically near 0.35). The undoped layer 41 is covered by conducting layer 42 (typically made of metal or a heavily doped semiconductor material) and contacted electrically by gate contact 310. Also, there are electrical contacts 320 and 330 to layers 3 and 5, respectively. A two-dimensional electron gas is formed in region 151 of layer 15 and region 111 of layer 11 when an appropriate positive voltage is applied to contact 310; the tunneling probability of electrons through region 131 of layer 13 depends on the voltage at contact 310 as well as on source-drain bias voltage $V_{DS}$.

As will be appreciated by the skilled artisan, the structure depicted comprises an undoped planar quantum well, i.e., layer 13, which is surrounded by the double barrier layers 21 and 23 of AlGaAs. These in turn are sandwiched between two undoped GaAs layers 11 and 15 which are in contact with the heavily doped GaAs layers 3 and 5, respectively.

The particular embodiment depicted uses the AlGaAs materials system. Other embodiments using this materials system will be readily thought of by those skilled in the art as well as similar embodiments using other materials systems. For example, there may be a two-dimensional electron gas in layers 11 and 15 even in the absence of a gate voltage as, e.g., in a normally-on device.

The structure is conveniently grown, for example, by molecular beam epitaxy. Details of an expedient growth technique will be readily known to those skilled in the art and need not be given in detail. The working surface may be further defined by selective etching to form the V-groove and then subsequently overgrown epitaxially with the thin AlGaAs layer. Details of the etching and regrowth will be readily known to the skilled artisan. Electrical contacts may then be formed in well-known manner.

The overgrown layer 41 will be termed the gate barrier layer and both its thickness and the aluminum content in the layer are selected to minimize gate leakage. In particular, the gate barrier layer should have a bandgap greater than the bandgaps of the mesa layers. The thickness of the gate barrier layer should be greater than approximately 50 Angstroms to avoid excessive gate leakage by tunneling.

The quantum well barrier layers 21 and 23 preferably are made to have thicknesses, as measured along the slanted mesa surface, which are less than approximately 50 Angstroms each, larger values being undesirable because they could lead to a significantly reduced tunneling probability. The thicknesses ot the two undoped GaAs layers 11 and 15 outside the double-barrier region should be sufficiently large, typically greater than approximately 1000 Angstroms, to inhibit the creation of a parallel conduction path by conventional (bulk) resonant tunneling.

The aluminum content in the quantum well barrier layers typically corresponds to a value of x which is less than 0.45 to ensure optimum electron tunneling probability through the GlGaAs barrier; however, generally suitable are aluminum contents corresponding to values of x in a range of from 0.2 to 1.0.

The application of a positive gate voltage induces the formation of two-dimensional electron gases in the interface regions 151 and 111 of the edges of the respective undoped GaAs layers 1 and 5. These gases effectively act as the source and drain electrodes. The region 131 of layer 13 will be termed, as previously explained, a quantum well wire; this region exists because of the additional dimensional quantization in the direction parallel to the interface.

Figure 2:
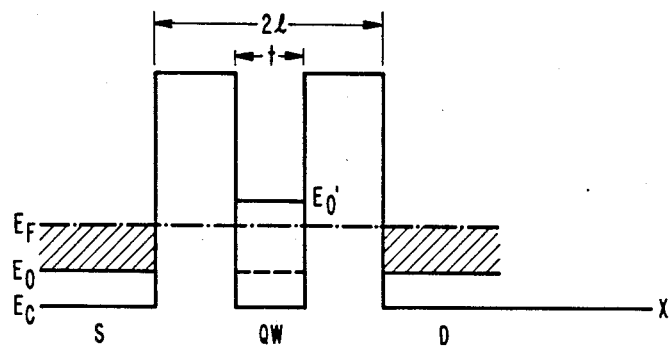
FIGS. 2 and 3 are energy band diagrams useful in explaining the operation of the device depicted in FIG. 1.

This may be better understood by considering the energy band diagram in the absence of a source-to-drain voltage as depicted in FIG. 2. The energy band diagram is taken along the x-axis as indicated in FIG. 1. For reasons of simplicity, only the conduction band is shown. As shown, this direction is parallel to the surface channel. The normal direction, i.e., the y-axis, is the direction normal to gate barrier layer 42, and the z-direction is along the quantum well wire, i.e., perpendicular to the plane of FIG. 1.

The additional dimensional quantization, in the x-direction results in a zero-point energy, $E_0'$, which is greater than the level indicated by $E_0$. The latter level corresponds to free motion in both the x- and z-directions. It is readily appreciated by those skilled in the art that, when the thicknesses of the undoped source and drain layers are sufficiently large, then the carrier motion in the x-direction in these layers can be considered as free. And it is similarly appreciated that in the quantum-well-wire region of the surface channel there is an additional dimensional quantization along the x-direction. As a result, energy levels are quantized in two directions and carriers move freely in only the z-direction.

The extra zero-point energy is given by $E_0'-E_0$, as illustrated in FIG. 2. If, in the following, t denotes the thickness of the quantum well layer as measured along the face of the mesa in the x-direction, then the extra energy is approximately equal to $\pi^2 \hbar^2/2mt^2$, where $\hbar$ is Planck's constant and m is the effective mass. Application of a gate voltage can move the two-dimensional sub-band $E_O$ with respect to the bottom of the conduction band, $E_C$, and the Fermi level, $E_F$. The contemplated operating regime of our device corresponds to the case in which the Fermi level lies in the interval between $E_0'$ and $E_O$.

Figure 3:
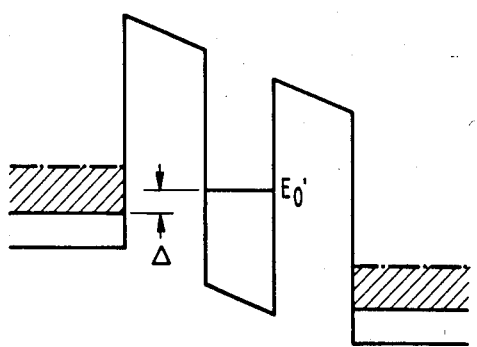

The energy band diagram for the resonant tunneling condition is depicted in FIG. 3. The range of energy of the carriers which can participate in resonant tunneling through the base is represented as $\Delta$. This condition is brought about by application of a drain voltage positive with respect to the source. In the resonant tunneling situation, some electrons in the source will have energy levels which match those of unoccupied levels in the quantum well wire. Some of these electrons, when conservation of lateral momentum is considered, can participate in resonant tunneling. However, not all electrons in this band of matched energy levels can tunnel because of the requirement of momentum conservation. As the drain voltage increases, more carriers can undergo resonant tunneling. At a sufficiently high drain voltage, however, there will be no electrons in the source which can tunnel into the quantum well wire and also conserve lateral momentum. Thus, a negative differential resistance occurs in the drain circuit and the current will decrease as the voltage increases.

Figure 4:
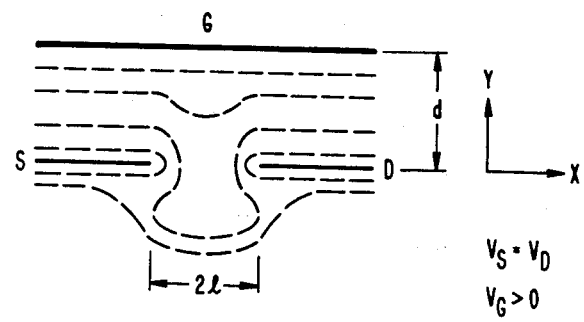
FIGS. 4 and 5 show the electrostatic potential distribution in the surface resonant tunneling structure.

In addition to controlling the resonant tunneling by the source-drain voltage, the gate voltage may also be utilized to control the tunneling. This is better understood by considering the electric fields depicted in FIGS. 4 and 5. The projections of equipotential surfaces are shown as broken lines. The electric field configuration for the situation in which the source voltage $V_S$ is equal to the drain voltage $V_D$ and in which the gate voltage $V_G$ is positive is depicted in FIG. 4. The structure is equivalent to a double parallel-plate capacitor with a common electrode, namely the gate electrode. The separation d between the parallel plates is equal to the thickness of the AlGaAs gate barrier layer, and the slit width 2 l is equal to the thicknesses of the tunneling barrier layers and the quantum well layer as measured along the face of the mesa in the x-direction.

Figure 5:
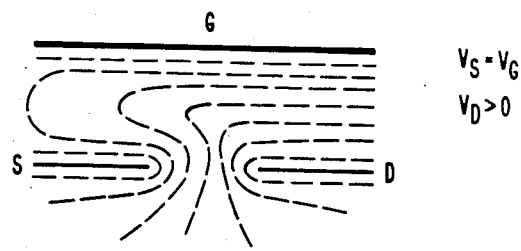

The electric field configuration for equal source and gate voltages together with a positive drain voltage is depicted in FIG. 5. A detailed analysis, using a conformal mapping, shows that when the value of d is near l, the gate potential is nearly as effective in lowering the level in the quantum wire with respect to $E_0$ in the source as is the drain potential. The details of this transformation and analysis will be readily apparent to those skilled in the art and need not be given in detail. However, it can be shown that the gate potential is nearly as effective in lowering the value of $E_0'$ in the quantum well wire relative to $E_0$ in the source (and thus in affecting the resonant tunneling condition), as is the source-drain voltage.

Of course, the typical operating regime involves the situation in which both $V_G$ is positive as well as $V_D$ is greater than $V_S$, in which case no suitable conformal mapping onto a simple-connected domain is available. It is clear in this respect that the effects described above in connection with FIG. 4 and 5 can be treated as additive, at least qualitatively. As a result, the gate potential can be used to control the resonant-tunneling condition set up by the source-to-drain voltage. In particular, if $\Delta$ is initially greater than or equal to zero for a fixed drain voltage, $\Delta$ can be made to go negative by further increasing the gate voltage. The result is that the tunneling current decreases and a range of negative transconductance has been achieved.

Such a device, namely a transistor having negative transconductance can perform the functions of a complementary device analogous to a p-channel transistor in silicon CMOS technology. And, a circuit formed by combining a conventional n-channel field effect transistor with a negative transconductance transistor can act as a low-power inverter in which a significant current flows only during switching.

While the invention has been described primarily as making use of a single GaAs quantum well, alternate structures are not precluded. For example, such quantum well may be supplanted by a superlattice of alternating layers of GaAs and AlGaAs. Also, there are embodiments of the invention based on the movement of holes instead of electrons, for example, utilizing silicon barriers instead of AlGaAs barriers and a silicon-germanium alloy instead of GaAs for the low-bandgap material. Furthermore, such structure may be be replaced by a superlattice of alternating layers of silicon and silicon-germanium.

What is claimed is:

1. A semiconductor device comprising first and second semiconductor regions;
   a third semiconductor region which forms a quantum well wire layer and is capable of exhibiting carrier motion quantized in two-dimensions (x and y) and free in a third-dimension (z) said third region being between said first and second semiconductor regions;
   first and second electrical contacts to said first and second regions, respectively; and
   means for applying an electric field to said third region.

2. A device as recited in claim 1 in which said first and second regions are capable of exhibiting one-dimensional (y) quantization, carriers being free in two dimensions (x and z) thus forming first and second quantum wells.

3. A device as recited in claim 2 in which said third region further comprises two barrier layers on opposed sides of said quantum well wire layer.

4. A device as recited in claim 3, said means for applying an electric field comprising a third barrier layer contacting said first, second and third regions, and said third barrier layer having a bandgap greater than the bandgaps of said first, second and third regions.

5. A device as recited in claim 4, said means for applying an electric field comprising a conducting gate layer on said third barrier layer and an electric contact to said conducting gate layer.

* * * * *